United States Patent
Wu et al.

(10) Patent No.: US 11,542,604 B2
(45) Date of Patent: Jan. 3, 2023

(54) HEATING APPARATUS AND CHEMICAL VAPOR DEPOSITION SYSTEM

(71) Applicant: PlayNitride Display Co., Ltd., MiaoLi County (TW)

(72) Inventors: Jyun-De Wu, MiaoLi County (TW); Yen-Lin Lai, MiaoLi County (TW); Chi-Heng Chen, MiaoLi County (TW)

(73) Assignee: PlayNitride Display Co., Ltd., MiaoLi County (TW)

(*) Notice: Subject to any disclaimer, the term of this patent is extended or adjusted under 35 U.S.C. 154(b) by 210 days.

(21) Appl. No.: 16/868,539

(22) Filed: May 7, 2020

(65) Prior Publication Data
US 2021/0130957 A1 May 6, 2021

(30) Foreign Application Priority Data

Nov. 6, 2019 (TW) .................. 108140232
Nov. 6, 2019 (TW) .................. 108140233

(51) Int. Cl.
*C23C 16/46* (2006.01)
*C23C 16/458* (2006.01)
*H01L 33/00* (2010.01)

(52) U.S. Cl.
CPC .......... *C23C 16/46* (2013.01); *C23C 16/4584* (2013.01); *H01L 33/005* (2013.01)

(58) Field of Classification Search
CPC .... C23C 16/46; C23C 16/4584; H01L 33/005
(Continued)

(56) References Cited

U.S. PATENT DOCUMENTS 5,294,778 A * 3/1994 Carman ............ H01L 21/67103
338/217
5,536,918 A * 7/1996 Ohkase ............ H01L 21/67115
118/724
(Continued)

FOREIGN PATENT DOCUMENTS

CN 101023197 8/2007
CN 101101855 1/2008
(Continued)

OTHER PUBLICATIONS

"Office Action of China Counterpart Application", dated Feb. 19, 2021, p. 1-p. 8.
(Continued)

*Primary Examiner* — Charlee J. C. Bennett
(74) *Attorney, Agent, or Firm* — JCIPRNET (57) ABSTRACT

A heating apparatus including a rotating stage, a plurality of wafer carriers, a first heater, and a second heater is provided. The rotating stage includes a rotating axis. The plurality of wafer carriers is disposed on the rotating stage. The rotating stage drives the wafer carriers to rotate on the rotating axis. The first heater is disposed under the rotating stage. The first heater includes a first width in a radial direction of the rotating stage. The second heater is disposed under the rotating stage. The second heater and the first heater are separated from each other. The second heater includes a second width in the radial direction of the rotating stage, and the first width is not equal to the second width. A chemical vapor deposition (CVD) system using the heating apparatus is also provided.

11 Claims, 7 Drawing Sheets

(58) Field of Classification Search
USPC .......................................................... 118/725
See application file for complete search history.

(56) References Cited

U.S. PATENT DOCUMENTS

| | | | | |
|---|---|---|---|---|
| 5,958,140 | A * | 9/1999 | Arami | ..................... C30B 25/10 |
| | | | | 156/345.52 |
| 6,184,498 | B1 * | 2/2001 | Kiyama | .................. H01L 22/20 |
| | | | | 118/724 |
| 6,492,625 | B1 * | 12/2002 | Boguslavskiy | ... H01L 21/68764 |
| | | | | 219/486 |
| 6,843,201 | B2 * | 1/2005 | Kuznetsov | .......... C23C 16/4583 |
| | | | | 219/390 |
| 8,106,335 | B2 | 1/2012 | Murakami et al. | |
| 10,138,551 | B2 * | 11/2018 | Colvin | ..................... C23C 16/46 |
| 10,287,686 | B2 * | 5/2019 | Zhao | ..................... C23C 16/46 |
| 2003/0047132 | A1 * | 3/2003 | Boguslavskiy | .......... C30B 25/12 |
| | | | | 117/200 |
| 2003/0233768 | A1 * | 12/2003 | Kaeppeler | ............. C30B 25/165 |
| | | | | 34/560 |
| 2008/0251376 | A1 | 10/2008 | Takizawa et al. | |
| 2011/0073039 | A1 * | 3/2011 | Colvin | ..................... C23C 16/46 |
| | | | | 219/490 |
| 2011/0185969 | A1 * | 8/2011 | Yang | ....................... C30B 25/10 |
| | | | | 118/666 |
| 2011/0259879 | A1 * | 10/2011 | Hanawa | .............. C23C 16/4584 |
| | | | | 118/725 |
| 2012/0221138 | A1 * | 8/2012 | Hong | ................ H01L 21/68764 |
| | | | | 700/299 |
| 2014/0287142 | A1 | 9/2014 | Boyd et al. | |
| 2017/0002462 | A1 | 1/2017 | Bodin et al. | |
| 2019/0244839 | A1 * | 8/2019 | Lindberg | ................ C30B 25/10 |
| 2021/0130958 | A1 * | 5/2021 | Wu | ......................... C30B 25/10 |

FOREIGN PATENT DOCUMENTS

| | | |
|---|---|---|
| CN | 105624644 | 6/2016 |
| CN | 205803594 | 12/2016 |
| CN | 206328463 | 7/2017 |
| CN | 107004583 | 8/2017 |
| EP | 2010694 | 3/2011 |
| JP | 2002050461 | 2/2002 |
| JP | 2003007432 | 1/2003 |
| JP | 2003234170 | 8/2003 |
| JP | 3642746 | 4/2005 |
| JP | 4467730 | 5/2010 |
| JP | 5513767 | 6/2014 |
| TW | 201131011 | 9/2011 |
| TW | 201343958 | 11/2013 |
| TW | 201520366 | 6/2015 |
| TW | 201636451 | 10/2016 |
| TW | 201718931 | 6/2017 |

OTHER PUBLICATIONS

"Office Action of China Related Application No. 201911075445.5", dated Mar. 3, 2021, pp. 1-8.
"Office Action of China Counterpart Application", dated Oct. 14, 2021, p. 1-p. 8.
"Office Action of Taiwan Related Application, application No. 108140232", dated Jul. 7, 2020, p. 1-p. 6.
"Office Action of Taiwan Counterpart Application", dated Jul. 7, 2020, p. 1-p. 6.

* cited by examiner

HEATING APPARATUS AND CHEMICAL VAPOR DEPOSITION SYSTEM

CROSS-REFERENCE TO RELATED APPLICATION

This application claims the priority benefits of Taiwan application serial no. 108140233, filed on Nov. 6, 2019, and Taiwan application serial no. 108140232, filed on Nov. 6, 2019. The entirety of each of the above-mentioned patent applications is hereby incorporated by reference herein and made a part of this specification.

BACKGROUND OF THE INVENTION

Field of the Invention

The disclosure relates to a film deposition apparatus, and in particular, to a heating apparatus and a chemical vapor deposition (CVD) system.

Description of Related Art

With continuous improvements in operating performance and reliability of light-emitting diode materials, the light-emitting diode materials are gradually applied to diversified fields, for example, lighting devices, displays, and backlight modules. To satisfy performance specifications under various different usage requirements, light-emitting diode elements of different structures or materials continuously challenge design and mass production capabilities of relevant manufacturers. For example, to meet a required display quality (for example, color rendering or brightness uniformity of a display surface) requirement, film thickness uniformity of an epitaxial layer of a micro light-emitting diode applied to a display needs to be better.

In a process of forming an epitaxial film of a micro light-emitting diode element, a CVD technology is one of the commonly used technical means. However, as the size of the epitaxial substrate increases and the size of the light-emitting diode element decreases, the traditional CVD device can no longer satisfy the temperature uniformity requirement of the epitaxial substrate during film formation.

SUMMARY OF THE INVENTION

The invention provides a heating apparatus, which may provide favorable temperature uniformity of an epitaxial substrate.

The invention provides a CVD system, which has favorable film uniformity.

The heating apparatus of the invention includes a rotating stage, a plurality of wafer carriers, a first heater, and a second heater. The rotating stage includes a rotating axis. The plurality of wafer carriers is disposed on the rotating stage. The rotating stage drives the wafer carriers to rotate on the rotating axis. The first heater is disposed under the rotating stage. The first heater includes a first width in a radial direction of the rotating stage. The second heater is disposed under the rotating stage. The second heater and the first heater are separated from each other. The second heater includes a second width in the radial direction of the rotating stage, and the first width is not equal to the second width.

In an embodiment of the invention, the wafer carrier of the heating apparatus includes a wafer carrier diameter, and a ratio of the first width to the wafer carrier diameter is greater than 0.5 and less than 1.

In an embodiment of the invention, the first heater of the heating apparatus includes a first temperature, the second heater includes a second temperature, and the first temperature is not equal to the second temperature.

In an embodiment of the invention, the heating apparatus further includes a third heater, disposed under the rotating stage. The third heater, the second heater, and the first heater are separated from one another. The third heater includes a third width in the radial direction of the rotating stage, and the third width is not equal to the first width and the second width.

In an embodiment of the invention, a vertical projection of each wafer carrier of the heating apparatus on the rotating stage partially overlaps a vertical projection of the first heater on the rotating stage, and a ratio of a vertical projection area of the first heater on the wafer carrier to an area of the wafer carrier is greater than or equal to 0.4 and less than or equal to 0.9.

In an embodiment of the invention, a symmetry center of each wafer carrier of the heating apparatus overlaps a vertical projection of the first heater on the wafer carriers.

In an embodiment of the invention, there is a spacing between each of the plurality of wafer carriers of the heating apparatus and a first surface of the rotating stage.

In an embodiment of the invention, there is a first spacing between a first wafer carrier of the plurality of wafer carriers of the heating apparatus and a first surface of the rotating stage, there is a second spacing between a second wafer carrier of the plurality of wafer carriers and the first surface of the rotating stage, and the first spacing is not equal to the second spacing.

The CVD system of the invention includes a chamber, a heating apparatus, a rotation driving mechanism, and an air inlet unit. The heating apparatus is disposed in the chamber, and includes a rotating stage, a plurality of wafer carriers, a first heater, and a second heater. The rotating stage includes a rotating axis. The plurality of wafer carriers is disposed on the rotating stage. The rotating stage drives the wafer carriers to rotate on the rotating axis. The first heater is disposed under the rotating stage. The first heater includes a first width in a radial direction of the rotating stage. The second heater is disposed under the rotating stage. The second heater and the first heater are separated from each other. The second heater includes a second width in the radial direction of the rotating stage, and the first width is not equal to the second width. The rotation driving mechanism is connected to the rotating stage and drives the rotating stage to rotate. The air inlet unit is connected to the chamber and located above the rotating stage.

In an embodiment of the invention, the wafer carrier of the CVD system includes a wafer carrier diameter, and a ratio of the first width to the wafer carrier diameter is greater than 0.5 and less than 1.

In an embodiment of the invention, the first heater of the CVD system includes a first temperature, the second heater includes a second temperature, and the first temperature is not equal to the second temperature.

In an embodiment of the invention, a vertical projection of each wafer carrier of the CVD system on the rotating stage partially overlaps a vertical projection of the first heater on the rotating stage, and a ratio of a vertical projection area of the first heater on the wafer carrier to an area of the wafer carrier is greater than or equal to 0.4 and less than or equal to 0.9.

In an embodiment of the invention, a symmetry center of each wafer carrier of the CVD system overlaps a vertical projection of the first heater on the wafer carriers.

In an embodiment of the invention, there is a spacing between each of the plurality of wafer carriers of the CVD system and a first surface of the rotating stage.

In an embodiment of the invention, there is a first spacing between a first wafer carrier of the plurality of wafer carriers of the CVD system and a first surface of the rotating stage, there is a second spacing between a second wafer carrier of the plurality of wafer carriers and the first surface of the rotating stage, and the first spacing is not equal to the second spacing.

In an embodiment of the invention, the heating apparatus of the CVD system further includes a wafer carrier driving unit, disposed on the rotating stage and configured to drive the wafer carriers to respectively spin on a spinning axis.

In an embodiment of the invention, the wafer carrier driving unit of the CVD system includes a plurality of gas pipelines disposed in the rotating stage, and the gas pipelines are located under the plurality of wafer carriers.

Based on the above, in the heating apparatus and the CVD system in an embodiment of the invention, the widths of the first heater and the second heater that are separated from each other are different, so that temperature uniformity of an epitaxial substrate can be effectively improved, a film developed on the epitaxial substrate may have favorable thickness uniformity, and uniformity of light emission of a subsequently formed micro light-emitting diode chip is also improved.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 1:
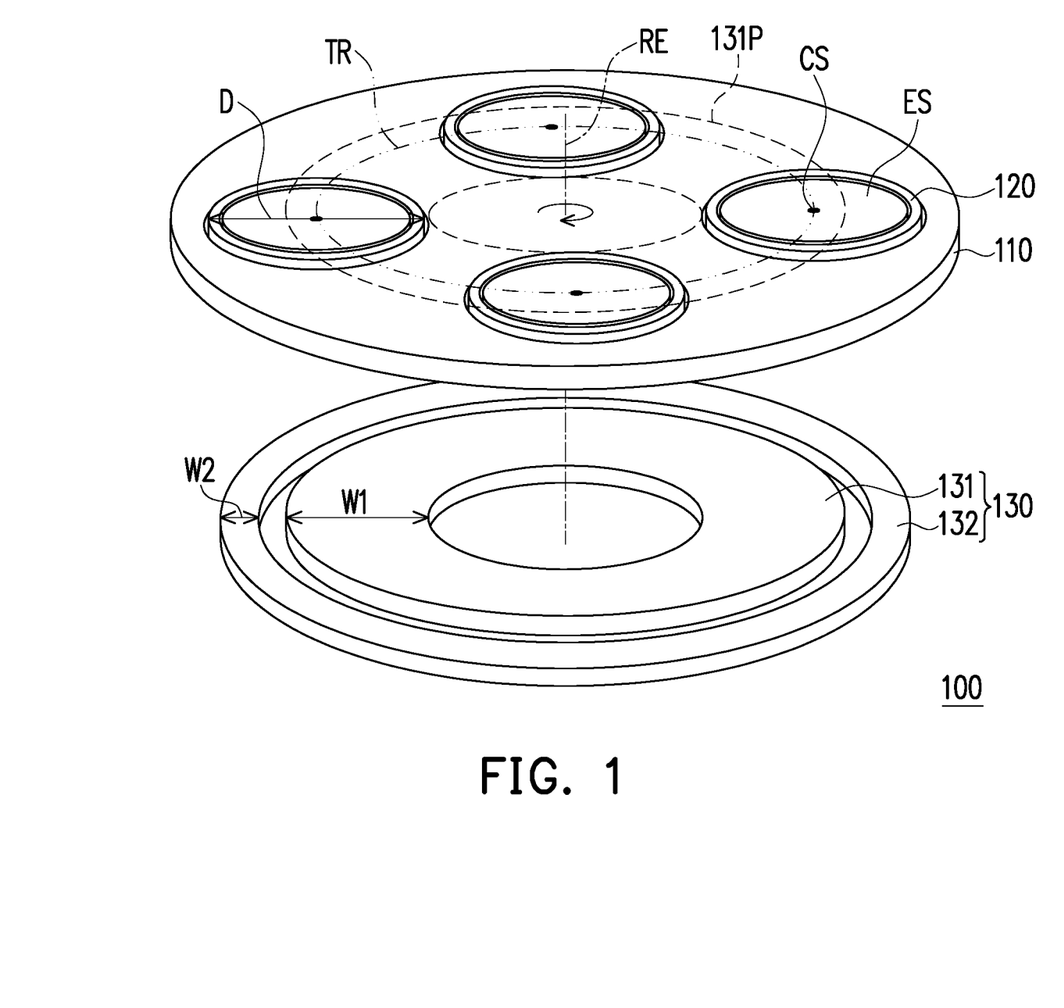
FIG. 1 is a schematic partial exploded view of a heating apparatus according to a first embodiment of the invention.
Figure 2:
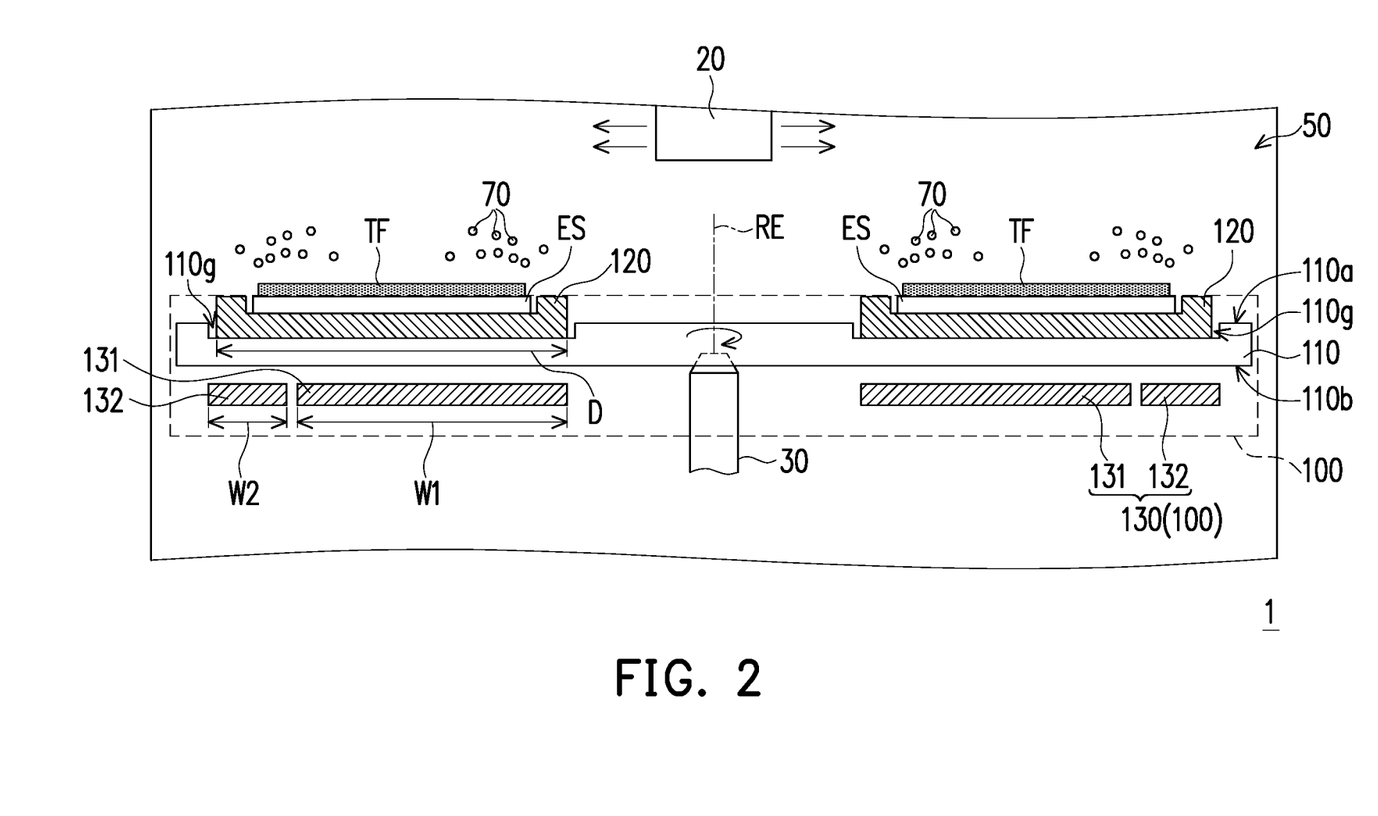
FIG. 2 is a schematic cross-sectional view of a CVD system according to an embodiment of the invention.

FIG. 1 is a schematic partial exploded view of a heating apparatus according to a first embodiment of the invention. FIG. 2 is a schematic cross-sectional view of a CVD system according to an embodiment of the invention. Referring to FIG. 1 and FIG. 2, the CVD system 1 includes a chamber 50, a heating apparatus 100, an air inlet unit 20, and a rotation driving mechanism 30. The heating apparatus 100 includes a rotating stage 110, a plurality of wafer carriers 120, and a heater 130. The wafer carrier 120 is configured to position an epitaxial substrate ES on the rotating stage 110. The wafer carrier 120 and the heater 130 are respectively disposed on two opposite sides of the rotating stage 110. Specifically, the rotating stage 110 includes a first surface 110a and a second surface 110b that are opposite and a plurality of grooves 110g provided on the first surface 110a. These wafer carriers 120 are respectively disposed in these grooves 110g and protruding from the first surface 110a of the rotating stage 110. The second surface 110b of the rotating stage 110 is facing the heater 130.

In the present embodiment, for example, there are four wafer carriers 120, but it does not indicate that the invention is limited by the content disclosed in the figure. In other embodiments, the number of wafer carriers 120 may be adjusted according to an actual process requirement (for example, the size of the epitaxial substrate or the rotating stage). The heating apparatus 100 is disposed in the chamber 50. The rotation driving mechanism 30 is linked to the rotating stage 110 to drive the rotating stage 110 to rotate. The air inlet unit 20 is connected to the chamber 50 and located above the rotating stage 110. In the present embodiment, the air flows into the chamber 50 from two sides of the air inlet unit 20, but is not limited thereto. In other embodiments, an air inlet opening may also be disposed below the air inlet unit 20. During film forming, the heating apparatus 100 may maintain a surface temperature of the epitaxial substrate ES at a predetermined value, the rotation driving mechanism 30 is used to drive the rotating stage 110 to maintain a rotation speed. Meanwhile, a process gas 70 (for example, a vaporized precursor or other reaction gases) is delivered to the chamber 50 through the air inlet unit 20, and a required epitaxial film TF is formed on the epitaxial substrate ES through chemical reaction of these process gases 70. In the present embodiment, the epitaxial substrate ES is, for example, a silicon wafer, a sapphire substrate, a silicon carbide (SiC) substrate, or other suitable substrates, and the epitaxial film TF is, for example, a gallium nitride (GaN) film, but is not limited thereto.

Further, the rotating stage 110 also includes a rotating axis RE, and each of these wafer carriers 120 is driven by the rotating stage 110 to rotate on the rotating axis RE. In the present embodiment, for example, there are two heaters 130, namely, a first heater 131 and a second heater 132, and in a radial direction of the rotating stage 110, the first heater 131 is located between the second heater 132 and the rotating axis RE, but the invention is not limited thereto. In other embodiments, alternatively, the second heater may be located between the first heater and the rotating axis RE. For example, vertical projections of these heaters 130 on the rotating stage 110 may surround the rotating axis RE. However, the invention is not limited thereto. According to other embodiments, the heater may include a plurality of separated segments, and these segments are respectively disposed in a plurality of sections overlapping rotation paths of these wafer carriers 120.

In addition, the wafer carrier 120 includes a symmetry center CS, and the rotating stage 110 rotates to drive the symmetry center CS to form a rotation track TR surrounding the rotating axis RE. It is specially noted that, in an axial direction of the rotating axis RE, the rotation track TR overlaps a vertical projection 131P of the first heater 131 on the rotating stage 110. In other words, in a rotation process of the wafer carrier 120, the symmetry center CS of the wafer carrier 120 always overlaps the vertical projection 131P of the first heater 131 on the wafer carrier 120. In the present embodiment, rotation paths of the plurality of wafer carriers 120 roughly overlap each other (that is, the rotation tracks TR of the symmetry centers CS of these wafer carriers 120 roughly overlap each other), but the invention is not limited thereto. In other embodiments, alternatively, the rotation tracks TR of the symmetry centers CS of these wafer carriers 120 may be staggered from each other.

The first heater 131 includes a first width W1 in the radial direction of the rotating stage 110, and the wafer carrier 120 includes a wafer carrier diameter D in the radial direction of the rotating stage 110 (that is, the radial direction of the rotating stage 110 herein passes through the symmetry center CS of the wafer carrier 120). It is specially noted that, a ratio of the first width W1 of the first heater 131 to the wafer carrier diameter D of the wafer carrier 120 is greater than 0.5 and less than 1. Therefore, the first heater 131 may heat only a partial region of the wafer carrier 120, helping improve temperature uniformity of the epitaxial substrate ES, and enabling the epitaxial film TF developed on the epitaxial substrate ES to have favorable thickness uniformity. In some embodiments, a ratio of the vertical projection area of the first heater 131 on the wafer carrier 120 to an area of the wafer carrier 120 may be greater than or equal to 0.4 and less than or equal to 0.9, helping further improve the temperature uniformity of the epitaxial substrate ES.

Further, the second heater 132 also partially overlaps the wafer carrier 120 in the axial direction of the rotating axis RE, and includes a second width W2 in the radial direction of the rotating stage 110, and the second width W2 is not equal to the first width W1 of the first heater 131. More specifically, the second width W2 of the second heater 132 is less than the first width W1 of the first heater 131. In the present embodiment, the first heater 131 has a first temperature, the second heater 132 has a second temperature, and the first temperature is not equal to the second temperature, so that the heater 130 can heat a plurality of regions of the wafer carrier 120, helping improve the temperature uniformity of the epitaxial substrate ES, and enabling the epitaxial film TF developed on the epitaxial substrate ES to have favorable thickness uniformity. It should be understood that, in the present embodiment, the epitaxial substrate ES may be heated through thermal radiation and thermal conduction. More specifically, thermal energy provided by the heater 130 may be transmitted to the second surface 110b of the rotating stage 110 through thermal radiation, and then transmitted to the epitaxial substrate ES through thermal conduction of the rotating stage 110 and the wafer carrier 120, but the invention is not limited thereto.

The following is to list some other embodiments to describe the disclosure in detail, where the same components are to be marked with the same symbols, and descriptions of the same technical content are omitted. For the omitted part, refer to the above embodiments, and the descriptions thereof are omitted below.

Figure 3:
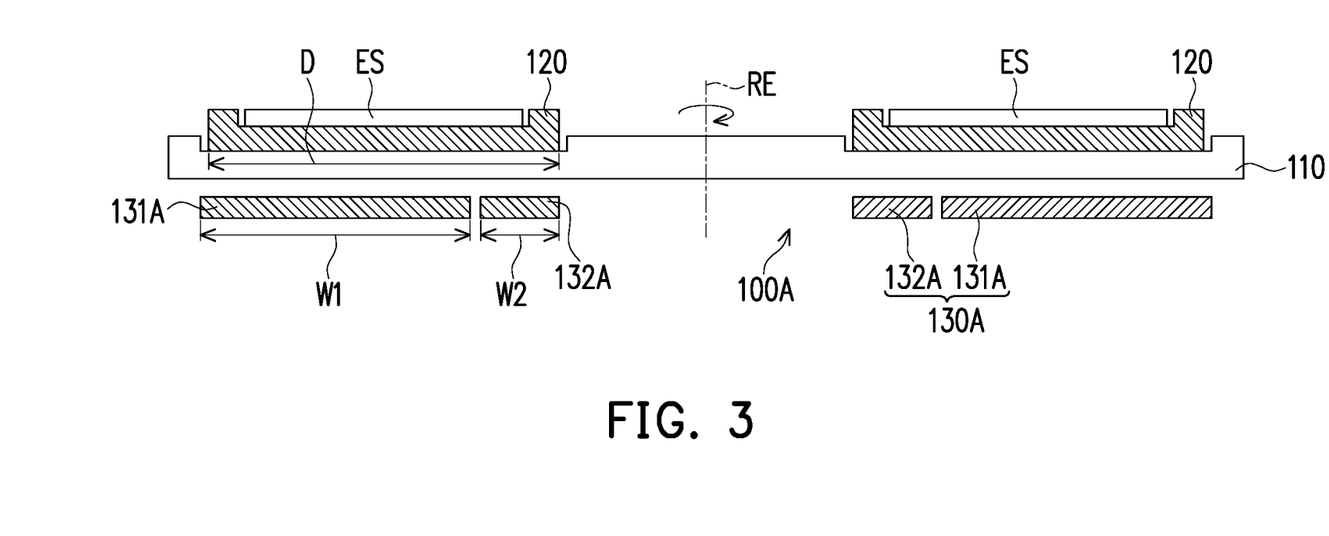
FIG. 3 is a schematic cross-sectional view of a heating apparatus according to a second embodiment of the invention.

FIG. 3 is a schematic cross-sectional view of a heating apparatus according to a second embodiment of the invention. Referring to FIG. 3, a main difference between the heating apparatus 100A in the present embodiment and the heating apparatus 100 in FIG. 2 is that the heater is configured in different manners. Specifically, in the radial direction of the rotating stage 110, a second heater 132A of a heater 130A is located between a first heater 131A and the rotating axis RE. In the present embodiment, a configuration relationship between the first heater 131A and the wafer carrier 120 is similar to that of the heating apparatus 100 in the foregoing embodiment, and the descriptions thereof are omitted herein.

It is specially noted that, a ratio of a first width W1 of the first heater 131A to the wafer carrier diameter D of the wafer carrier 120 is greater than 0.5 and less than 1. Therefore, the first heater 131A may heat only a partial region of the wafer carrier 120, helping improve temperature uniformity of the epitaxial substrate ES, and enabling the epitaxial film TF developed on the epitaxial substrate ES to have favorable thickness uniformity. In addition, the second heater 132A includes a second width W2 in the radial direction of the rotating stage 110, and the second width W2 is not equal to the first width W1 of the first heater 131A. More specifically, the second width W2 of the second heater 132A is less than the first width W1 of the first heater 131A. In the present embodiment, the first heater 131A has a first temperature, the second heater 132A has a second temperature, and the first temperature is not equal to the second temperature, so that the heater 130A can heat a plurality of regions of the wafer carrier 120, helping improve the temperature uniformity of the epitaxial substrate ES, and enabling the epitaxial film TF developed on the epitaxial substrate ES to have favorable thickness uniformity.

Figure 4:
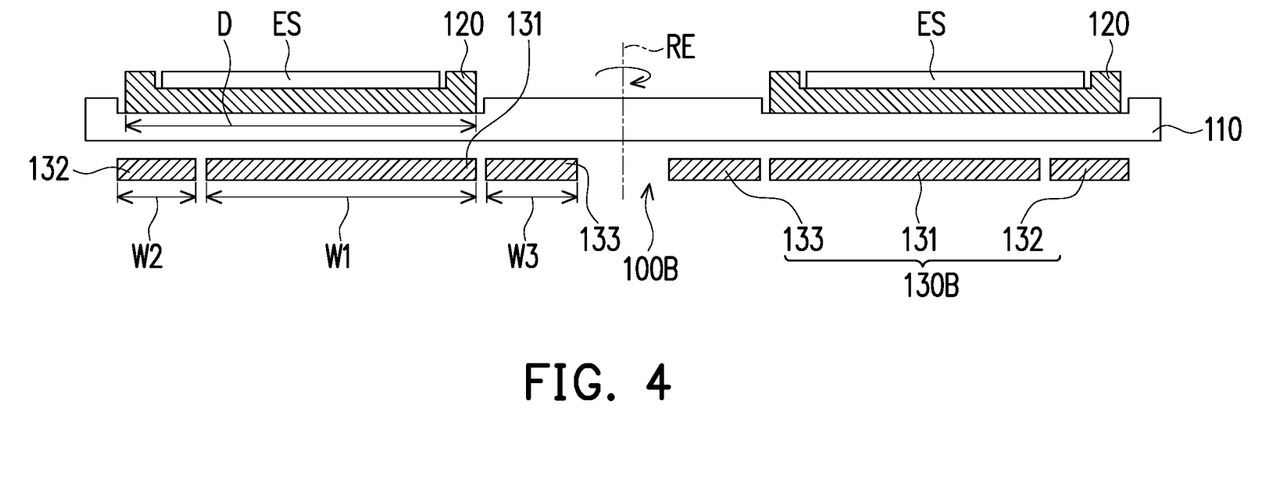
FIG. 4 is a schematic cross-sectional view of a heating apparatus according to a third embodiment of the invention.

FIG. 4 is a schematic cross-sectional view of a heating apparatus according to a third embodiment of the invention. Referring to FIG. 4, a main difference between the heating apparatus 100B in the present embodiment and the heating apparatus 100 in FIG. 2 is that the number of the heaters is different. In the present embodiment, the heating apparatus 100B further includes a third heater 133, and in the radial direction of the rotating stage 110, the third heater 133 is located between the first heater 131 and the rotating axis RE. The first heater 131, the second heater 132, and the third heater 133 are separated from one another, and the third heater 133 does not overlap the wafer carrier 120 in the axial direction of the rotating axis RE. In this way, a capability of a heater 130B for adjusting temperature distribution of the epitaxial substrate ES in the radial direction can be improved. In the present embodiment, a configuration relationship between the first heater 131, the second heater 132, and the wafer carrier 120 is similar to that of the heating apparatus 100 in the foregoing embodiment, and the descriptions thereof are omitted herein.

Further, the third heater 133 has a third width W3 in the radial direction of the rotating stage 110, and the third width W3 of the third heater 133 is not equal to the first width W1 of the first heater 131 and the second width W2 of the second heater 132. In the present embodiment, the third width W3 may be less than the first width W1 and greater than the second width W2, but the invention is not limited thereto. In other embodiments, alternatively, the third width W3 of the third heater 133 may be equal to the second width W2 of the second heater 132. In addition, the first heater 131, the second heater 132, and the third heater 133 may respectively have a first temperature, a second temperature, and a third temperature, and the first temperature is set not to be equal to the second temperature, and the third temperature is set not to be equal to the first temperature and the second temperature, so that the heater 130B can heat a plurality of regions of the wafer carrier 120, helping improve the temperature uniformity of the epitaxial substrate ES, and enabling the epitaxial film TF on the epitaxial substrate ES to have favorable thickness uniformity.

Figure 5:
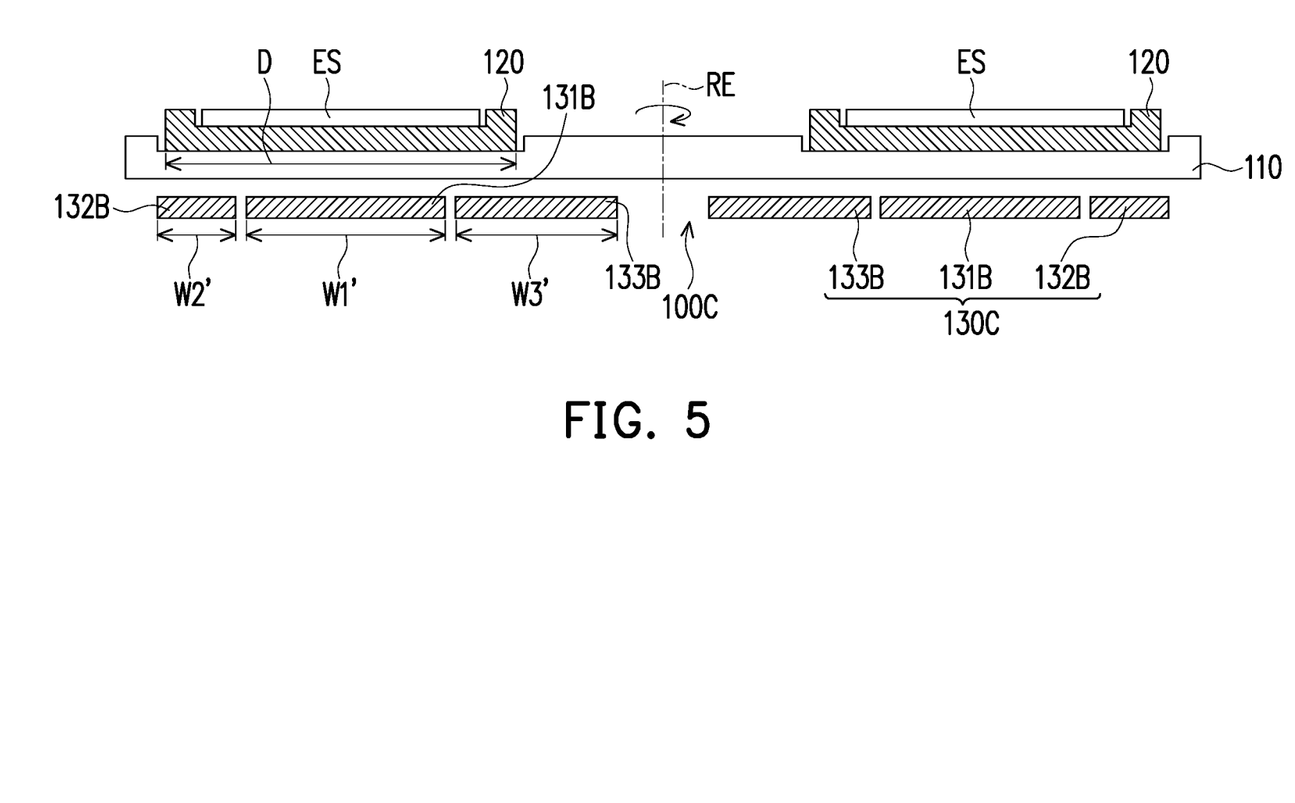
FIG. 5 is a schematic cross-sectional view of a heating apparatus according to a fourth embodiment of the invention.

FIG. 5 is a schematic cross-sectional view of a heating apparatus according to a fourth embodiment of the invention. Referring to FIG. 5, a main difference between the heating apparatus 100C in the present embodiment and the heating apparatus 100B in FIG. 4 is that the third heater is configured in different manners. Specifically, a third heater 133B of the heating apparatus 100C may overlap the wafer carrier 120 in the axial direction of the rotating axis RE. In this way, the temperature uniformity of the epitaxial substrate ES can be further improved. It is specially noted that, in the present embodiment, a configuration relationship between a first heater 131B, a second heater 132B, and the wafer carrier 120 is similar to that of the heating apparatus 100 in the foregoing embodiment, and the descriptions thereof are omitted herein.

Further, the third heater 133B has a third width W3' in the radial direction of the rotating stage 110, and the third width W3' of the third heater 133B is not equal to a first width W1' of the first heater 131B and a second width W2' of the second heater 132B. In the present embodiment, the third width W3' may be less than the first width W1' and greater than the second width W2', but the invention is not limited thereto. In addition, the first heater 131B, the second heater 132B, and the third heater 133B may respectively have a first temperature, a second temperature, and a third temperature, and the first temperature is set not to be equal to the second temperature and the third temperature is set not to be equal to the first temperature and the second temperature, so that a heater 130C can heat a plurality of regions of the wafer carrier 120, helping improve the temperature uniformity of the epitaxial substrate ES, and enabling the epitaxial film TF on the epitaxial substrate ES to have favorable thickness uniformity.

Figure 6:
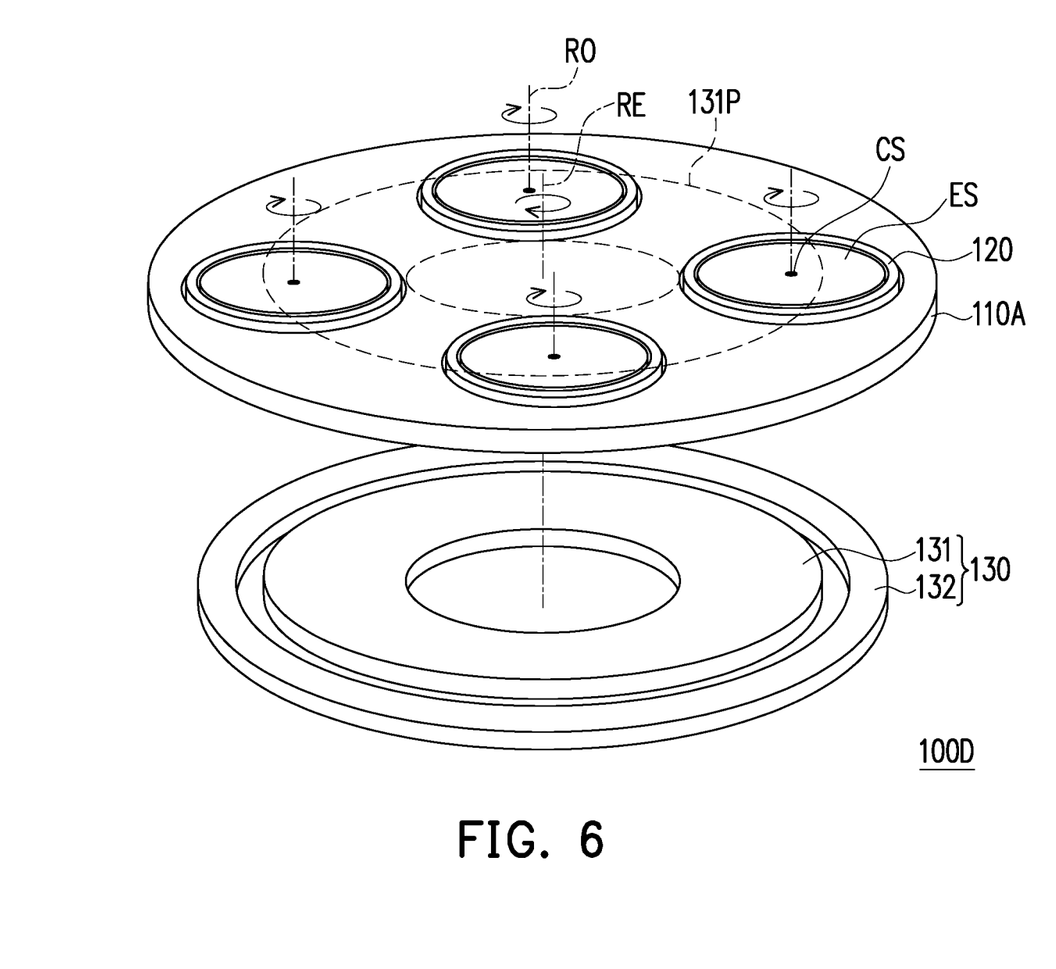
FIG. 6 is a schematic partial exploded view of a heating apparatus according to a fifth embodiment of the invention.
Figure 7:
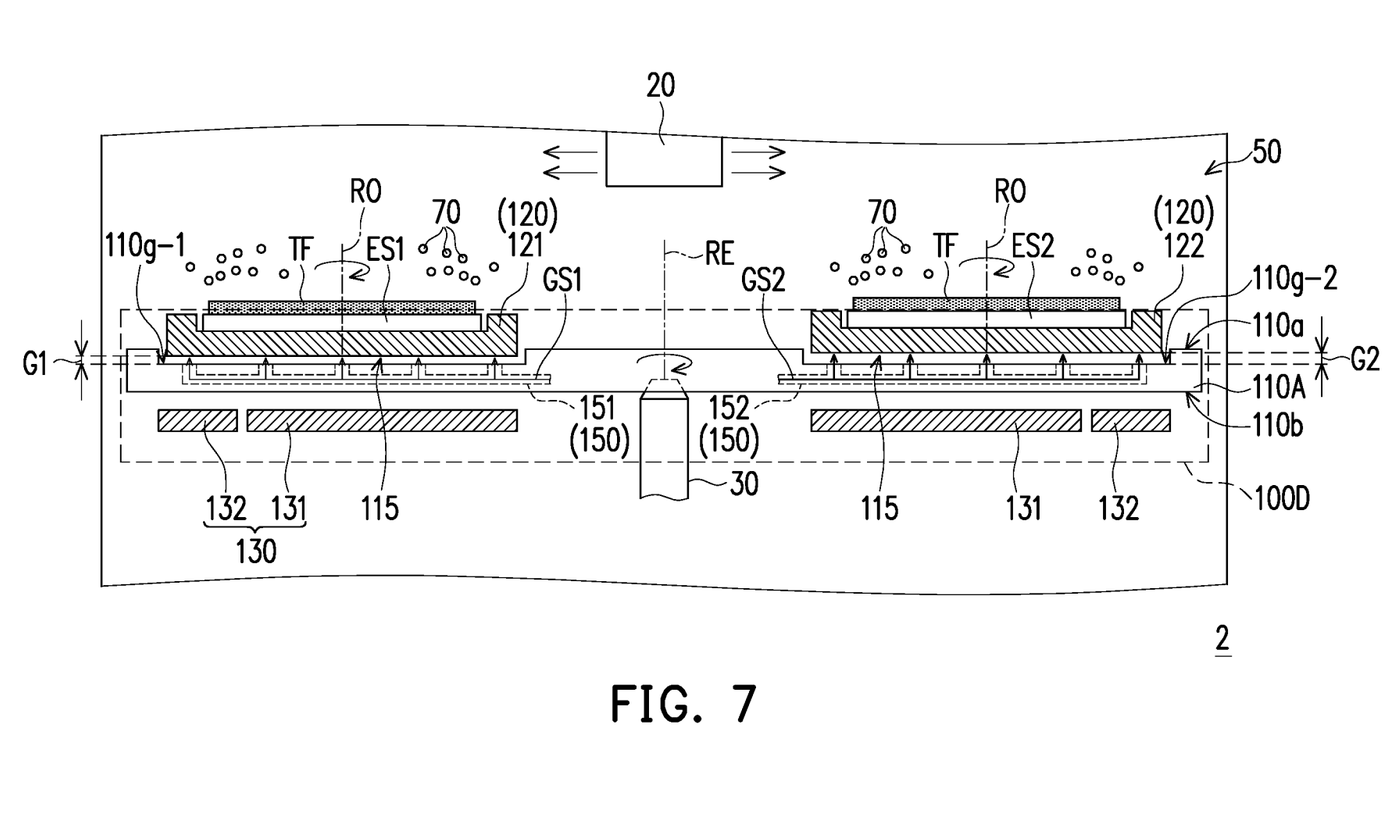
FIG. 7 is a schematic cross-sectional view of a CVD system according to another embodiment of the invention.

FIG. 6 is a schematic partial exploded view of a heating apparatus according to a fifth embodiment of the invention. FIG. 7 is a schematic cross-sectional view of a CVD system according to another embodiment of the invention. It is specially noted that, for clear presentation, a wafer carrier driving unit 150 of FIG. 7 is omitted in FIG. 6.

Referring to FIG. 6 and FIG. 7, a main difference between a CVD system 2 and a heating apparatus 100D in the present embodiment and the CVD system 1 and the heating apparatus 100 in FIG. 2 is that the heating apparatus 100D further includes the wafer carrier driving unit 150, configured to drive the wafer carrier 120 to spin on a spinning axis RO, where the spinning axis RO passes through the symmetry center CS of the wafer carrier 120. In the present embodiment, the wafer carrier driving unit 150 includes a plurality of gas pipelines disposed in a rotating stage 110A, for example, a gas pipeline 151 and a gas pipeline 152, and the gas pipelines are located below the wafer carrier 120. These gas pipelines are configured to deliver an airflow to grooves (for example, a groove 110g-1 and a groove 110g-2) of the rotating stage 110A to flow between the wafer carrier 120 and the rotating stage 110A, so that a spacing 115 is formed between the wafer carrier 120 disposed in the grooves and the first surface 110a of the rotating stage 110A in the axial direction of the rotating axis RE, and the airflow drives the wafer carrier 120 to rotate. In this way, the temperature uniformity in the epitaxial substrate ES can be further improved. It should be noted that, in the present embodiment, a rotation direction and a spinning direction of the wafer carrier 120 are optionally the same (for example, are a clockwise direction), but the invention is not limited thereto. In other embodiments, alternatively, the rotation direction and the spinning direction of the wafer carrier 120 may be respectively a clockwise direction and a counter-clockwise direction.

In the present embodiment, the wafer carrier driving unit 150 delivers a first airflow GS1 to the groove 110g-1 in which the wafer carrier 121 is disposed, so that there is a first spacing G1 between the wafer carrier 121 and the first surface 110a of the rotating stage 110A in the axial direction of the rotating axis RE. The wafer carrier driving unit 150 delivers a second airflow GS2 to the groove 110g-2 in which the wafer carrier 122 is disposed, so that there is a second spacing G2 between the wafer carrier 122 and the first surface 110a of the rotating stage 110A in the axial direction of the rotating axis RE. Relative amounts of the first airflow GS1 and the second airflow GS2 are adjusted, so that the first spacing G1 between the wafer carrier 121 and the rotating stage 110A is not equal to the second spacing G2 between the wafer carrier 122 and the rotating stage 110A. For example, when there is a temperature difference between an epitaxial substrate ES1 and an epitaxial substrate ES2, a unit time flow of the first airflow GS1 is set to be less than a unit time flow of the second airflow GS2, to make the first spacing G1 less than the second spacing G2, to further reduce the temperature difference between the two epitaxial substrates. Alternatively, spinning speeds of these wafer carriers may be adjusted by using different airflows to improve film uniformity and improve epitaxial quality.

Based on the above, in the heating apparatus and the chemical vapor deposition system in an embodiment of the invention, the widths of the first heater and the second heater that are separated from each other are different, so that the temperature uniformity of the epitaxial substrate can be effectively improved, the film developed on the epitaxial substrate may have favorable thickness uniformity, and uniformity of light emission of a subsequently formed micro light-emitting diode chip is also improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A heating apparatus, comprising:
   a rotating stage, comprising a rotating axis;
   a plurality of wafer carriers, disposed on the rotating stage, wherein the rotating stage drives the wafer carriers to rotate on the rotating axis;
   a first heater, disposed under the rotating stage, wherein the first heater comprises a first width in a radial direction of the rotating stage, a first vertical projection of each of the wafer carriers on the rotating stage partially overlaps a second vertical projection of the first heater on the rotating stage, and a ratio of a vertical projection area of the first heater on the wafer carrier to an area of the wafer carrier is greater than or equal to 0.4 and less than or equal to 0.9;
   a second heater, disposed under the rotating stage, wherein the second heater and the first heater are separated from each other, the second heater comprises a second width in the radial direction of the rotating stage, the first width is not equal to the second width, each of the first heater and the second heater is formed in a closed ring shape, a symmetry center of each of the wafer carriers always overlaps a third vertical projection of the first heater on the wafer carriers, and the wafer carrier comprises a wafer carrier diameter, and a ratio of the first width to the wafer carrier diameter is greater than 0.5 and less than 1, wherein the second heater surrounds the first heater.

2. The heating apparatus according to claim 1, wherein the first heater comprises a first temperature, the second heater comprises a second temperature, and the first temperature is not equal to the second temperature.

3. The heating apparatus according to claim 1, further comprising:
  a third heater, disposed under the rotating stage, wherein the third heater, the second heater, and the first heater are separated from one another, the third heater comprises a third width in the radial direction of the rotating stage, and the third width is not equal to the first width and the second width.

4. The heating apparatus according to claim 1, wherein there is a spacing between each of the wafer carriers and a first surface of the rotating stage.

5. The heating apparatus according to claim 1, wherein there is a first spacing between a first wafer carrier of the wafer carriers and a first surface of the rotating stage, there is a second spacing between a second wafer carrier of the wafer carriers and the first surface of the rotating stage, and the first spacing is not equal to the second spacing.

6. A chemical vapor deposition system, comprising:
  a chamber;
  a heating apparatus, disposed in the chamber, wherein the heating apparatus comprises:
  a rotating stage, comprising a rotating axis;
  a plurality of wafer carriers, disposed on the rotating stage, wherein the rotating stage drives the wafer carriers to rotate on the rotating axis;
  a first heater, disposed under the rotating stage, wherein the first heater comprises a first width in a radial direction of the rotating stage, a first vertical projection of each of the wafer carriers on the rotating stage partially overlaps a second vertical projection of the first heater on the rotating stage, and a ratio of a vertical projection area of the first heater on the wafer carrier to an area of the wafer carrier is greater than or equal to 0.4 and less than or equal to 0.9; and
  a second heater, disposed under the rotating stage, wherein the second heater and the first heater are separated from each other, the second heater comprises a second width in the radial direction of the rotating stage, the first width is not equal to the second width, each of the first heater and the second heater is formed in a closed ring shape, a symmetry center of each of the wafer carriers always overlaps a third vertical projection of the first heater on the wafer carriers, and the wafer carrier comprises a wafer carrier diameter, and a ratio of the first width to the wafer carrier diameter is greater than 0.5 and less than 1;
  a rotation driving mechanism, connected to the rotating stage and driving the rotating stage to rotate; and
  an air inlet unit, connected to the chamber and located above the rotating stage, wherein the second heater surrounds the first heater.

7. The chemical vapor deposition system according to claim 6, wherein the first heater comprises a first temperature, the second heater comprises a second temperature, and the first temperature is not equal to the second temperature.

8. The chemical vapor deposition system according to claim 6, further comprising:
  a wafer carrier driving unit, disposed on the rotating stage and configured to drive the wafer carriers to respectively spin on a spinning axis.

9. The chemical vapor deposition system according to claim 8, wherein the wafer carrier driving unit comprises a plurality of gas pipelines disposed in the rotating stage, and the gas pipelines are located under the wafer carriers.

10. The chemical vapor deposition system according to claim 8, wherein there is a spacing between each of the wafer carriers and a first surface of the rotating stage.

11. The chemical vapor deposition system according to claim 8, wherein there is a first spacing between a first wafer carrier of the wafer carriers and a first surface of the rotating stage, there is a second spacing between a second wafer carrier of the wafer carriers and the first surface of the rotating stage, and the first spacing is not equal to the second spacing.

* * * * *